United States Patent [19]
Grodnensky et al.

[11] Patent Number: 5,835,227
[45] Date of Patent: Nov. 10, 1998

[54] METHOD AND APPARATUS FOR DETERMINING PERFORMANCE CHARACTERISTICS IN LITHOGRAPHIC TOOLS

[75] Inventors: Ilya Grodnensky, Foster City; Etsuya Morita, Dublin, both of Calif.; Kyoichi Suwa; Shigeru Hirukawa, both of Tokyo, Japan

[73] Assignee: Nikon Precision Inc., Belmont, Calif.

[21] Appl. No.: 818,375

[22] Filed: Mar. 14, 1997

[51] Int. Cl.⁶ ............................ G01B 11/00; G01B 11/02
[52] U.S. Cl. ............................ 356/399; 356/383
[58] Field of Search ...................... 356/399–401, 356/384, 387, 390, 394, 352, 124, 124.5, 127, 355, 357, 432, 443; 355/43, 45, 53, 77; 250/548

[56] References Cited

U.S. PATENT DOCUMENTS

| | | | |
|---|---|---|---|
| 4,744,662 | 5/1988 | Suto et al. | 356/372 |
| 4,908,656 | 3/1990 | Suwa et al. | 355/53 |
| 5,576,829 | 11/1996 | Shiraishi et al. | 356/354 |
| 5,615,006 | 3/1997 | Hirukawa et al. | 356/124 |
| 5,661,546 | 8/1997 | Taniguchi | 355/53 |

OTHER PUBLICATIONS

"Impact of Local Partial Coherence Variations on Exposure Tool Performance," Borodovsky, Y., Proceedings of the SPIE, vol. 2440, pp. 750–770, Feb. 1995.

"Automatic Laser Scanning Focus Detection Method Using-Printed Focus Pattern," Suwa, K., et al., Proceedings of the SPIE, vol. 2440, pp. 712–720, Feb. 1995.

"Detailed Study of a Phase–Shift Focus Monitor," Pugh, G., et al., Proceedings of the SPIE, vol. 2440, p. 690, et seq., Feb. 1995.

*Primary Examiner*—Frank G. Font
*Assistant Examiner*—Michael P. Stafira
*Attorney, Agent, or Firm*—Joseph T. FitzGerald

[57] ABSTRACT

A method and apparatus for determining performance characteristics in lithographic tools includes projecting a predetermined image with a projection system having a known predetermined performance characteristic to obtain data indicative of the relationship between the size of the projected image and the predetermined performance characteristic. The same image is then projected in a system having an unknown value for the predetermined performance characteristic. The predetermined performance characteristic for the system under consideration is then determined based on the data obtained when the image was projected in the system having the known predetermined performance characteristic.

54 Claims, 6 Drawing Sheets

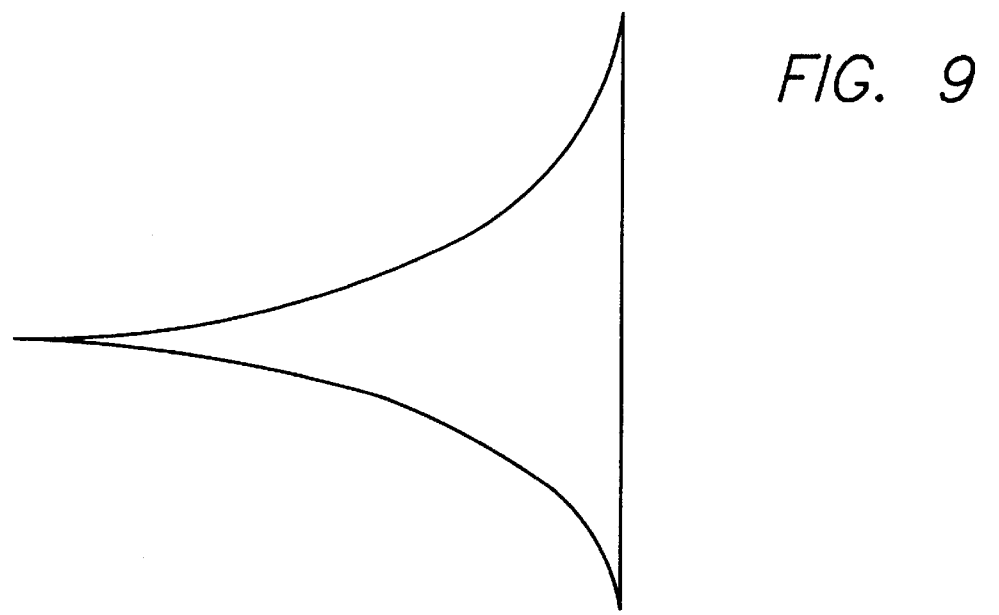
FIG. 9
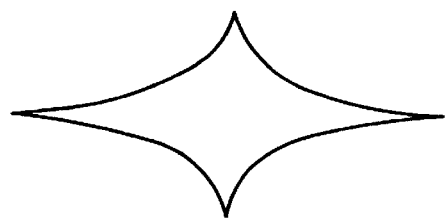
FIG. 10
FIG. 11
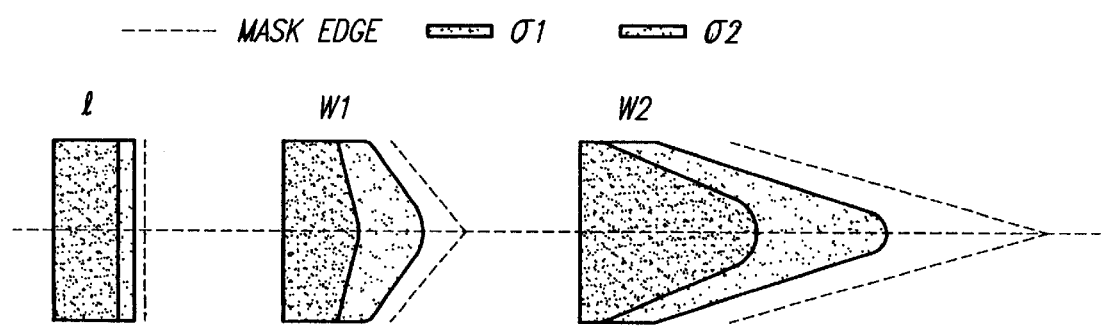

METHOD AND APPARATUS FOR DETERMINING PERFORMANCE CHARACTERISTICS IN LITHOGRAPHIC TOOLS

1. FIELD OF THE INVENTION

The present invention relates to a method and apparatus for determining performance characteristics in lithographic tools. More particularly, the present invention relates to a method and apparatus for determining the effective partial coherence factor (or sigma value) in a lithography system used to expose a photosensitive substrate in the preparation of semiconductor devices, liquid crystal display devices, magnetic film devices and other devices.

2. BACKGROUND OF THE INVENTION

Manufacturers of projection exposure systems are constantly striving to produce systems capable of creating semiconductor and other devices having the smallest possible linewidths. The linewidth is a determining factor in the density which can be achieved in, for example, an integrated circuit. As such, it is also a determining factor in the size of the final integrated circuit produced. As the circuitry becomes more and more advanced, thus involving a greater number of circuit elements, in order to avoid increasing the size of semiconductor devices, exposure systems must be capable of achieving a greater density in the circuits which are formed on semiconductor substrates. In addition, increasing the density enables a corresponding reduction in the size of existing semiconductor devices, thus enabling a reduction in the size of the products incorporating such devices. In addition, smaller linewidths are also required for lower voltage operations and are desired to increase the speed of the devices. This constant striving for increased density (and thus reduced linewidths) is rapidly approaching the limits in resolution which can be achieved with projection exposure systems.

Of course, it should be understood that the issue of resolution involves more than merely reducing a given image to the smallest possible size. Projection exposure systems also have to ensure that whatever size is chosen for the exposure, the exact size, proper depth of focus and sufficient contrast of the projected image are obtained across the image plane or exposure field. As the resolution increases, the tolerances in parameters such as linewidth variation, depth of focus and contrast become tighter.

The resolution of the projection exposure system is controlled by several factors, including the wavelength of the light used to provide the illumination for the exposure system, the numerical aperture of the projection lens or optical system ($NA_{pl}$), and the coherence of the light from the light source. Those skilled in the art will appreciate that there is a trade-off between the maximum achievable resolution and the usable depth of focus in a lithographic system. In the case were an image needs to be reproduced on a given topography, the usable depth of focus can be a more significant factor to the user of the system than the achievable resolution. If the image cannot be reproduced on a given topography due to depth of focus limitations, the theoretical maximum achievable resolution will mean little to the user of the system. Thus, the usable depth of focus can often determine the overall performance of the lithographic system. Between the maximum achievable resolution and the depth of focus, there is generally an optimum trade-off point. The maximum resolution and depth of focus characteristics will combine to determine if a system is suitable for the image which is to be projected.

Of course, most users of lithographic systems do not necessarily attempt to utilize a projection exposure system at the highest attainable resolution or maximum depth of focus. More important to such users is the ability to consistently produce an image at a desired resolution and usable depth of focus which has uniform image characteristics across the image plane or exposure field. Both the resolution and depth of focus, which directly contribute to the consistency of the image, are a function of the wavelength of the incident radiation, the numerical aperture of the projection lens and the effective partial coherence factor across the exposure field.

Specifically, in addition to the projection lens system, projection exposure systems also include an illumination optical system having a numerical aperture $NA_{ill}$. The illumination optics, which may include a lens, mirror, or other suitable optical element, receives the light from the projection system's light source and illuminates the mask or reticle to produce the image which is then focused by the projection lens or optical system onto an image plane where a substrate being subjected to the lithography process is placed. The ratio of the numerical aperture of the illumination optics to that of the projection lens or optical system ($NA_{ill}/NA_{pl}$) is called the partial coherence factor, or sigma ($\sigma$). It is also known by other names, such as the spatial partial coherency value, pupil filling function, or simply the symbol $\sigma$. For purposes of this description, the terms partial coherence factor and sigma will be used interchangeably. It is known that the exact size of the projected image, depth of focus, and contrast across the image plane depend strongly on the partial coherence factor.

However, the ratio of $NA_{ill}/Na_{pl}$ is actually a "nominal" value for the partial coherence factor or sigma ($\sigma$). In reality, sigma is known to fluctuate across the exposure field. The "nominal" sigma value is typically found at the center of the image plane or exposure field, but sigma is known to deviate from the nominal value, resulting in "effective" sigma values at different locations in the exposure field. The effective sigma values are not constant and may vary by as much as 10% or more in a given system in the same exposure field. Sigma variations across the field, which may be caused by lamp asymmetries, shutter configurations, fly's eye lens configuration, manufacturing errors or other factors, have been known to drastically reduce the tolerances associated with the projection exposure process, and even make production impossible.

In the case of modern projection exposure systems using so-called i-line illumination from a high pressure mercury lamp as the illumination source (wavelength $\lambda=0.365$ $\mu$m), when such a system is used to produce semiconductor devices including multiple layers, the critical dimension (CD) (i.e. target linewidth) is typically in the range of 0.30–0.50 $\mu$m. In the case of projection exposure systems utilizing a KrF laser as the illumination source ($\lambda=0.248$ $\mu$m), the CD is typically in the range of 0.25–0.30 $\mu$m. For these CD values, the across chip linewidth variation (ACLV), which represents the tolerance range for allowable variations in linewidth across the image plane of the device being exposed, the minimum value of the depth of focus (DOF) and overlay tolerance between different layers have very tight specifications.

For example, in an i-line production process ($\lambda=0.365$ $\mu$m), typical design rules demand the ACLV to be in the range of ±0.015–0.020 $\mu$m or less. Such fabrication processes also need DOF to be on the order of 0.5 $\mu$m or more, over a 22×22 mm exposure field or shot area. As discussed above, in a typical projection exposure system, design, materials and assembly variations can cause the effective partial coherence factor to vary across the image field. Additionally, the effective sigma value can vary from machine to machine even if the machines have equal $NA_{ill}$ and $NA_{pl}$ design values.

The inventors have determined that a ~20% variation in the partial coherence factor in systems attempting to achieve the above specifications (e.g. for critical dimensions, depth of focus and overlay tolerances), can lead to a rapid degradation of these parameters. The variation in the partial coherence factor can drop the depth of focus below its minimum level while leaving the ACLV and overlay tolerances outside of design parameters. As a result of partial coherence variations, projection exposure systems have difficulty delivering the same degree of process control on different layers exposed on the same machine or on the same layers exposed on the different machines. As the microelectronics industry strives to achieve smaller design geometry, measurement and control of the partial coherence factor has become increasingly important.

Since it is known that the effective partial coherence factor of an exposure system actually varies across the image plane or exposure field, being able to determine the effective sigma across the exposure field or image plane is critical in resolving problems associated with unsatisfactory across chip linewidth variations, depth of focus and contrast problems. By determining the sigma variations across the exposure field, the sigma for the system can often be adjusted to correct for unsatisfactory conditions or to bring non-conforming parameters into acceptable ranges.

A known method for adjusting the effective partial coherence factor in optical projection systems is based on a property of undeveloped photoresist. After the photoresist undergoes a normal exposure to a reticle or mask pattern, a latent image is created. The image contrast of the latent image depends on the partial coherence factor, i.e. sigma. This method involves exposing a layer of photoresist in a projection exposure system with an initial sigma value. After this initial exposure, the light scattered and reflected by the latent image in the undeveloped photoresist is measured. This data is analyzed and the sigma value is then adjusted to improve contrast of the latent image.

One drawback with the above-described method is that the contrast of the latent image may be heavily influenced by other parameters such as aberrations in optical elements, defocus and an improper exposure energy dose. Each of these factors can drastically influence the contrast modulation produced in the photoresist. Another drawback of this method is that image contrast is highly sensitive to photoresist type, thickness of the photoresist layer and process conditions. As a result, the sensitivity of the above-described method to sigma variations is low. In addition, this method does not allow for accurate adjustments of the sigma value and is not always reproducible. The method also requires a specialized tool, a phase contrast microscope, to measure the light scattered and reflected by the latent image.

Another known method for measuring sigma utilizes a correlation between sigma and deviations in the image size caused by proximity effects. Proximity effects occur when, for example, densely packed features in the image are not projected with the same dimensions as isolated features. It has been determined that, at a given distance between features, the difference in feature size depends on numerical aperture and sigma. Thus, sigma can be determined by observing the differences in the image features. Specifically, this method includes the steps of exposing a photoresist layer using a reticle having a plurality of lines having equal linewidths but having different distances between each line. The photoresist is then developed and the width of lines in the photoresist is measured and plotted based on the distance between them. The obtained data is then fitted with a computer simulated curve which uses sigma as a variable parameter. By determining which theoretical curve best matches the experimental data, the value of sigma in the image field where lines were printed and measured is determined.

There are several drawbacks to this method. To achieve high sensitivity, this method employs lines having widths which are close to that of the wavelength of the light used to expose the layer. For example, in the case of i-line exposure systems ($\lambda$=0.365 $\mu$m), the width of lines in the image field is typically 0.4 $\mu$m. In this situation, the widths of the printed lines are very sensitive to other uncontrollable or difficult to control parameters. For example, aberrations in optical elements and deviations in the focus position of a projection apparatus can each cause variations in the linewidths. As a result, linewidth variations caused by proximity effects are often comparable to the linewidth variations due to these uncontrollable or difficult to control parameters.

Further, the widths of lines change due to slight differences in focus across the field. There are two major difficulties in determining focus at each location. One is that to find the best focus position, the image needs to be exposed multiple times with the focus value (Z-position along the optical axis) being varied for each exposure. This requires extra printing of the image and measurements must be made for each printing. The other major difficulty with determining focus is that it is extremely difficult to define the best focus position based on the width of a printed image.

Another significant limitation of this method is that the relationship between linewidth and the distance between lines is also dependent on other parameters besides the partial coherence factor. For example, the characteristics of the photoresist and the process parameters can strongly influence the exposure process. In addition, because the sigma-dependent linewidth variations are very small, measurement of such variations involves the use of a scanning electron microscope (SEM). SEM techniques also have limits in resolution and accuracy. The above-discussed factors each contribute to decrease the accuracy of this method for determining variations in the partial coherence factor. For example, the accuracy of the measurements performed in this method are on the order of 0.01 to 0.015 $\mu$m. Such accuracy is actually comparable to the linewidth change when the partial coherence factor changes by ten percent. As a result, these accuracy limitations will preclude using this method to determine sigma changes of ten percent or less. In addition, this method is slow due to the large number of measured lines needed to obtain the data required. As anyone familiar with the semiconductor and photolithography industry will readily appreciate, time is an extremely valuable commodity. Unnecessary delays often translate directly to lost revenue.

Accordingly, there is a clear need for a method and apparatus which allows for rapid and reproducible measurements of variations in the partial coherence factor (sigma) across the image plane or exposure field in optical projection and lithography systems. There is also a clear need for an accurate method and apparatus for determining sigma variations which is not sensitive to other parameters or uncontrollable characteristics such as optical aberrations, defocus, exposure energy, photoresist properties or process conditions.

3. SUMMARY OF THE INVENTION

The present invention overcomes the above and other drawbacks associated with prior art techniques for determining partial coherence factors and provides a fast, economical and reliable technique for determining sigma in lithography systems. The present invention utilizes images which are sensitive to partial coherence variations together with an optical technique for measuring the length of the image. In addition to being sensitive to sigma variations, the images utilized by the present invention, and the technique used to measure the images, are not significantly influenced by other uncontrollable (or difficult to control) factors or parameters of the exposure system such as optical aberrations. Thus, the present invention provides a method and apparatus which enables the determination of the effective sigma value with increased accuracy.

In addition, the present invention provides a technique for determining effective sigma values which is machine and process independent, thus enabling the technique to be utilized in, for example, fabrication facilities which utilize a variety of projection exposure systems and techniques. In addition, the images which are utilized by the present invention allow for the use of pre-existing metrology functions typically included in lithographic systems to perform measurements needed for the present invention. Such measurements, which are often used for alignment systems to align the overlay of a mask image onto a pre-existing image on a substrate, are quite precise due to the precision alignment required by lithographic systems. Since alignment systems and metrology functions are an essential part of virtually all modern lithographic equipment, the present invention does not require an additional tool to provide the measurements used to determine the effective sigma values across the exposure field as do the prior art methods discussed above. In addition, by relying on the automatic measurement functions described above (and in more detail below), the present invention provides a faster, more accurate and precise method and apparatus for determining the effective sigma values in lithographic systems.

In one embodiment of the present invention, the above and other objects are achieved by an apparatus for use in a lithography system which includes a source of illumination, a projection optical system, a mask stage, and a substrate stage. The apparatus includes a mask having a predetermined image formed thereon. The mask is disposed on the mask stage, while a substrate such as a semiconductor wafer, ceramic plate, etc. having a photosensitive layer formed thereon is disposed on the substrate stage. The illumination from the source of illumination causes the image on the mask to be projected onto the photosensitive layer through the projection optics. A measuring tool is provided for measuring a size of the image projected onto the photosensitive layer. The measurement tool produces a signal indicative of the size of the measured image which is then supplied to a look-up table of data. The look-up table stores data indicative of relationships between projected image size and at least one of a numerical aperture and sigma values. The look-up table produces a sigma value corresponding to the image size of the measured image and the numerical aperture of the projection optics.

In another embodiment of the present invention, a method is provided for determining the partial coherence factor in an exposure field of a projection exposure system which includes an illumination source, a projection lens and a substrate stage. The method includes the steps of illuminating an image formed on a mask with light from the illumination source. The illuminated image is projected by the projection lens onto a photosensitive layer formed on a substrate mounted on the substrate stage in the exposure field of the projection exposure system. The size of the projected image is then measured and compared with data indicative of previously determined relationships between projected image size and partial coherence factor values. As a result of this comparison, the partial coherence factor in the exposure field is determined. When a plurality of projected images across the exposure field are measured and compared, it is possible to obtain data indicative of the partial coherence factor variation across the exposure field.

In accordance with the above and other embodiments of the present invention, a novel, reliable and economical solution is provided for determining the partial coherence factor, or sigma ($\sigma$) value, at any location in the image plane or exposure field of a projection exposure or lithography system. In this fashion, when deviations occur across the image plane in the production process, it is now possible to immediately determine if such problems are due to sigma variations or other causes. In addition, once the sigma variations are known, those skilled in the art will readily appreciate that it is possible to adjust the exposure equipment to eliminate or minimize the sigma variations across the exposure field such that they do not interfere with production.

The above and other embodiments of the present invention, together with the attendant advantages thereof, will become clearer from a reading of the detailed description of the present invention when considered in conjunction with the drawings, of which the following is a brief description.

4. BRIEF DESCRIPTION OF THE DRAWINGS

FIG. 9 illustrates another alternative image pattern for use with a preferred embodiment of the present invention.

FIG. 10 illustrates another alternative image pattern for use with a preferred embodiment of the present invention.

FIG. 11 is a partial top view of different image types formed at different partial coherence values.

5. DETAILED DESCRIPTION OF THE PREFERRED EMBODIMENTS

Figure 1:
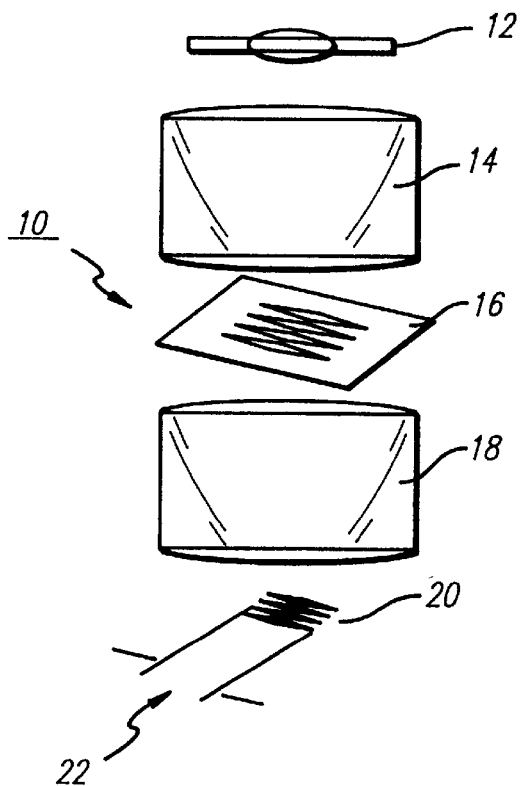
FIG. 1 is a block diagram of a projection exposure system incorporating a preferred embodiment of the present invention.

The following is a detailed description of the presently preferred embodiments. In this description, reference is made to the drawings in which like reference numbers refer to like elements. It should be understood, however, that the drawings are merely illustrative of the presently preferred embodiments of the invention. The drawings are not to be considered in a limiting sense and it is to be understood that the invention is in no way limited to the embodiments illustrated.

Referring to FIGS. 1–11, a projection exposure system 10 incorporating the present invention includes an illumination source 12. As those skilled in the art will readily appreciate, the illumination source 12 may be a high pressure mercury lamp, a krypton fluoride laser (KrF), ultraviolet radiation source, electron beam, or any other suitable illumination device or radiation source. The illumination from the source 12 passes through an illumination optical system 14 which may includes a lens structure or mirror optical system which receives the radiation from the illumination source 12 and projects it through the mask or reticle 16. As mentioned above, the illumination optical system may also include reflective optics, mirror optics, a shaped beam (e.g. a magnetically shaped beam such as an electron or ion beam) or other suitable system for controlling the illumination of the mask or reticle 16 with the desired source of illumination. The illumination which passes through the mask 16, which has a predetermined image formed thereon, is then received by a projection optical system 18. The projection optical system focuses the image received from the illumination passing through the mask or reticle 16 and produces an image 20 on a predetermined image plane. In, for example, the production of semiconductor devices utilizing a high pressure mercury lamp as the light source, a substrate having a photosensitive material layered thereon would be placed in the image plane. The photosensitive material would then be exposed by the light produced from the high pressure mercury lamp in accordance with the image 20 on the mask 16.

As can be seen in FIG. 1, the image 20 which is formed therein incorporates a series of wedge-shaped or diamond-shaped marks 24 having a length 22. There are several reasons that the inventors have utilized the wedge-shaped marks 24, although the present invention is in no way limited to use with wedge-shaped marks. The wedge-shaped marks 24 have been determined by the inventors to be particularly sensitive to variations in the partial coherence factor. In particular, referring to FIGS. 3 and 4, the pointed ends of the marks 24 which dictate the length of the marks, and the angle 25, are very sensitive to changes in the parameters of the projection system. Thus, when the marks are utilized in a system having known performance parameters (e.g. NA and illumination power), variations in projections of the marks have been found by the inventors to be indicative of changes in partial coherence values.

Marks of this shape have been used in the past for alignment purposes to align layers in semiconductor fabrication as well as to determine the optimum focus position for photolithography tools. An example of a system utilizing such marks can be seen in U.S. Pat. No. 4,908,656, entitled "METHOD OF DIMENSION MEASURMENT FOR A PATTERN FORMED BY EXPOSURE APPARATUS, AND METHOD FOR SETTING EXPOSURE CONDITIONS AND FOR INSPECTING EXPOSURE PRECISION," which patent is incorporated herein by reference in its entirety. The alignment system utilized in the '656 patent employs a system known as a laser step alignment ("LSA") system which utilizes a laser to automatically detect and measure with high precision the length of the wedge-shaped marks 24. The inventors determined that such measurements, in addition to being used for alignment purposes by the LSA system, could also be used as a measurement tool for measurements used to determine the partial coherence factor variations across the exposure field. The LSA system is capable of automatically detecting and measuring the length of wedge-shaped patterns 24. In the typical LSA system, the four wedge-shaped marks 24 would be repeated in groups of four or five (i.e., typically more than three such groups), with each group of four wedge marks being spaced by 8 µm to satisfy the diffraction requirement of the LSA alignment system. Of course, the present invention is not limited to use with four wedge-shaped marks 24 or the wedge-shaped mark in particular, as described in more detail below.

Figure 2:
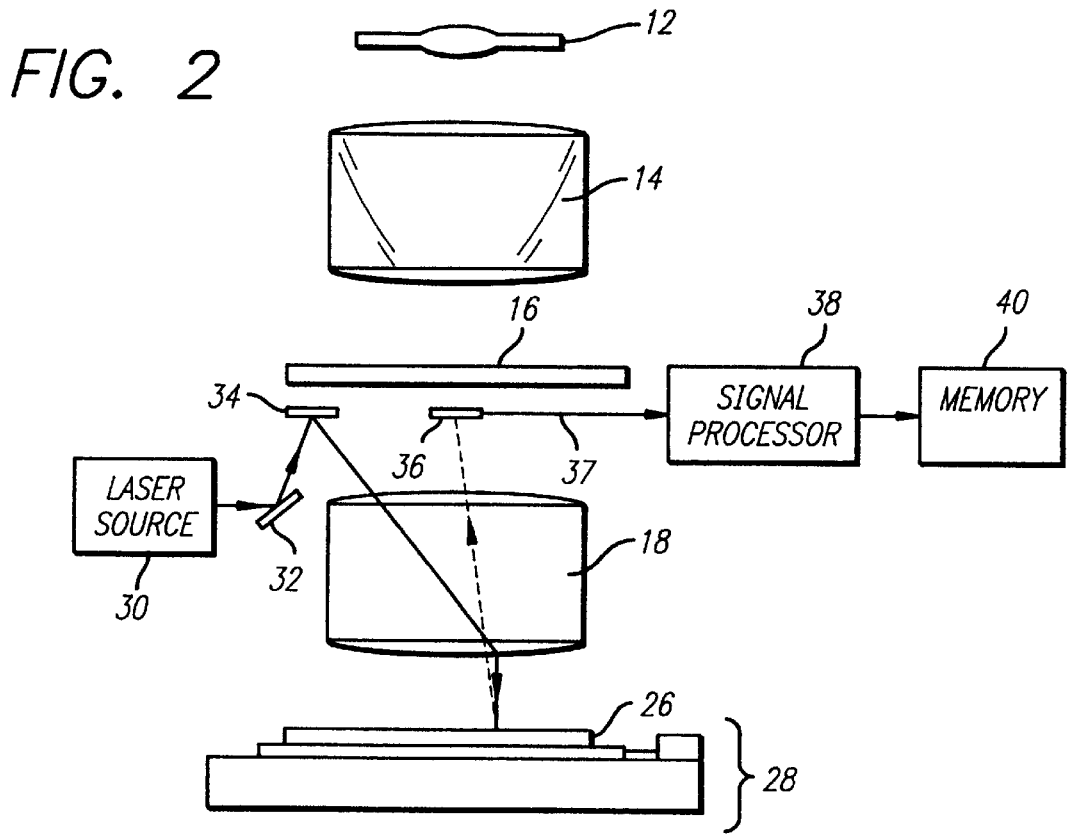
FIG. 2 is a block diagram of the projection exposure system of FIG. 1 showing details of the laser step alignment system used to obtain measurements of projected images for use with a preferred embodiment of the present invention.
Figure 3:
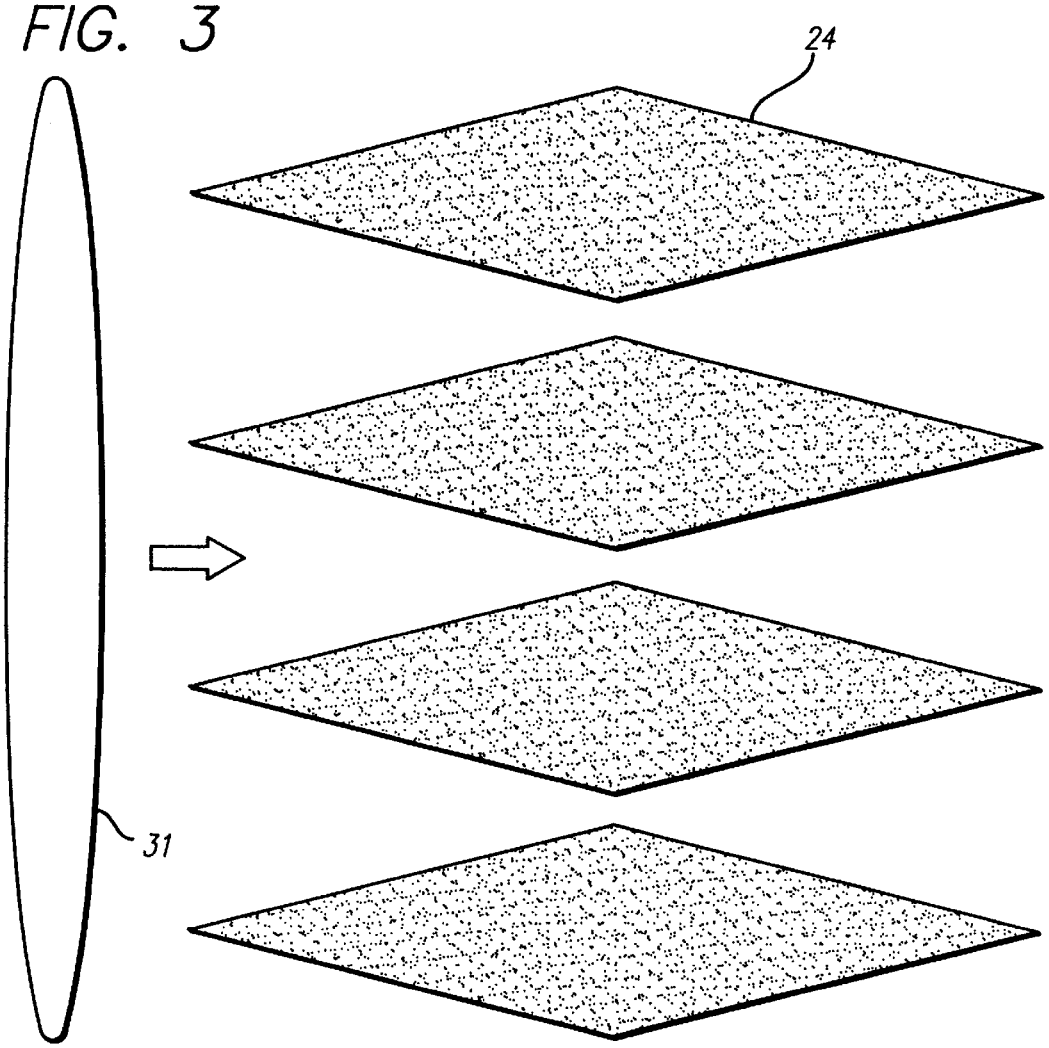
FIG. 3 is a detailed plan view of a group of four wedge-shaped image patterns used in a preferred embodiment of the present invention.

More particularly, referring to FIG. 2, in operation the LSA system measures the image formed on a substrate 26 supported on a stage generally referred to as 28. The stage 28 may be any suitable stage mechanism capable of movement in at least the X and Y directions. The substrate 26 is coated with a photoresist layer such that the projected image is formed in the photoresist layer on the substrate 26. The LSA system includes a laser light source 30 which projects a beam spot 31 that is reflected by mirrors 32 and 34 so that it passes through the projection lens 18. Referring to FIG. 3, the beam spot 31 is projected onto the photoresist and the stage 28 then moves the substrate 26 in such a manner that the wedge-shaped marks are scanned with the beam spot 31. The direction of scan is illustrated by the arrow in FIG. 3.

Referring again to FIG. 2, during the scanning operation referred to above, the LSA system utilizes a detector 36 which detects the light diffracted or scattered by the patterns of the marks 24 formed in the photoresist layer on the substrate 26 and generates a corresponding output signal 37. The output signal 37, which is related to the length of the marks 24. The signals 37 are supplied to a signal processor 38 which processes the signals to determine the length of the marks 24. The signal processor 38 may be any suitable signal processor, such as, for example, an Intel microprocessor, a Digital Equipment Corp. PDP series microprocessor, or other suitable signal processor. This information is then stored in memory 40. Those skilled in the art of semiconductor fabrication are familiar with the LSA technique and will readily appreciate the ability of the LSA system to measure the length of such marks.

Although the LSA system is the preferred system for measuring the marks 24, the present invention is not limited to use with an LSA system. The measurement of the wedge marks 24 can be made by other alignment systems or a separate measurement tool can be provided to measure the marks 24. Other types of alignment systems may be utilized as well with the present invention. For example, Field Image Alignment ("FIA") or Die-by-Die Alignment ("DDA") may also be used. As described in the above-mentioned '656 patent, in a DDA system, a simultaneous observation is made of an alignment mark on a reticle and an alignment mark on the wafer through the projection lens. In this type of system, the test pattern (e.g. wedge marks 24) and the photoresist pattern are observed simultaneously under magnification. The images, which can be observed with an image sensor such as an ITV sensor, are subjected to one or two dimensional image processing. In this fashion, the length of the photoresist pattern is determined from the image signals. The FIA system utilizes a CCD camera to observe and measure the marks. Whatever tool is used to measure the marks 24, the important factor in the measurement of the marks 24 is that the measurement must be accurate. The accuracy of the measurement will directly affect the accuracy of the determination of the sigma variations across the exposure field.

Figure 4:
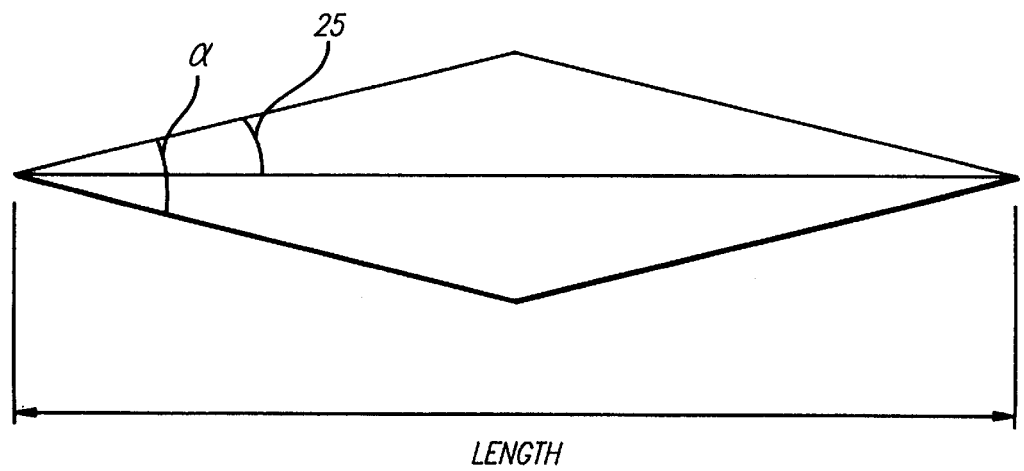
FIG. 4 is a detailed plan view of one wedge-shaped mark used in a preferred embodiment of the present invention.

Referring to FIGS. 3 and 4, although the width of the wedge mark 24 is typically on the order of 0.5 μm, the length of the mark is formed to be a large scale mark, typically on the order of 10 μm. That is, the length to width ratio is typically on the order of 20:1 or more, but is not limited to this ratio. By utilizing such a large scale, the present invention avoids sensitivity to uncontrollable factors such as optical aberrations, deviations in the focusing position of a projection apparatus, characteristics of the photoresist and other uncontrollable parameters. While the prior art methods discussed above studied linewidth measurements in an attempt to determine the partial coherence factor, the present invention utilizes the length of the marks under consideration. With the wedge-shaped marks 24 having a length greater than the width as discussed above, changes in the width are translated to changes in mark length which are capable of detection with enhanced sensitivity.

The inventors discovered that sensitivity of effective sigma determinations could be enhanced by utilizing the wedge-shaped marks 24. As seen in FIG. 11, a line l and two wedge-shaped marks W1 and W2 are illustrated. The dashed line represents the image edge on the mask, while the shaded portions represent the actual images formed in a system having effective sigma values of σ1 and σ2, respectively. In the prior art techniques discussed above that attempted to measure linewidth variations, as is clearly evident in FIG. 11, a very small change in linewidth for the line l occurs for the different sigma values σ1 and σ2. The small change in linewidth makes it difficult to determine the effective sigma value with great accuracy (or confidence). As discussed above, methods which attempt to determine sigma variations based on linewidth changes suffer from drawbacks such as the widths of the printed lines being sensitive to other uncontrollable or difficult to control parameters such as aberrations in optical elements, deviations in the focus position of a projection apparatus, etc. Further, the widths of lines change due to slight differences in focus across the field, and the relationship between linewidth and the distance between lines is also dependent on other parameters besides the partial coherence factor (e.g., photoresist and process parameters). As such, it is difficult to determine if the linewidth variations are due to changes in the partial coherence factor or other factors. In addition, because the sigma-dependent linewidth variations are very small, measurement of such variations involves the use of a SEM, which has other limitations.

However, utilizing the wedge-shaped marks 24 of the present invention, the same sigma values (i.e. σ1 and σ2 which produced minor linewidth variations for the line 1 produce noticeably enhanced changes in the length of the wedge-shaped marks (W1 and W2). By decreasing the size of the angle 25 seen in FIG. 4, the sensitivity to sigma variations is additionally enhanced as demonstrated by wedge W2 in the right portion of FIG. 11. The inventors have determined that the 0.5 μm width of the wedge-shaped marks 24, coupled with the 10 μm length, provides the optimum performance for sensitivity to sigma variations while at the same time avoiding influences from process conditions such as properties of the photoresist, developers, etc. While it is certainly possible to utilize marks having different widths, and the inventors have successfully utilized widths of 0.35 μm, 0.40 μm, and 0.45 μm, the 0.5 μm width is the presently preferred width for use with the present invention.

The size of the wedge-shaped marks 24 discussed above produces a preferred angle 25 of approximately two (2) to five (5) degrees at the point of the marks 24. This results in the angle 25 falling approximately in the range 2° to 5°, while the overall angle α at the point of the wedge-shaped marks 24 is approximately in the range of $10° \geq \alpha \geq 4°$. Marks having an overall angle in this range have been determined by the inventors to provide the preferred sensitivity to sigma variations for use with the present invention. Of course, the present invention is in no way limited to mark having an angle of three to five degrees, and those skilled in the art will appreciate that marks having other angles may be utilized without departing from the spirit of the present invention. Ideally, the smaller the angle 25 the greater the sensitivity will be to sigma variations. However, current photoresist technology yields a preferred angle in the above range due to the greater reliability of measurement data from images having such characteristics.

Further, the inventors have determined that by projecting a large scale mark such as the wedge marks 24, the length of the mark projected by the projection exposure system is directly dependent on the partial coherence factor. Since it is possible to accurately and reliably measure the length of such large marks 24 using, for example, the LSA system discussed above, the inventors determined that it would be possible to utilize such measurements to determine the partial coherence or sigma variations across the imaging field without requiring additional equipment or tools for such tasks. Those skilled in the art will readily appreciate that it is not a requirement of the present invention that wedge-marks, and in particular groups of four such marks, be utilized with the present invention. Any number of marks may be utilized with the present invention provided that suitable measurements may be easily and reliably obtained. The number of marks used will depend on, for example, the resolution and sensitivity of the measurement tool which is utilized.

Figure 8:
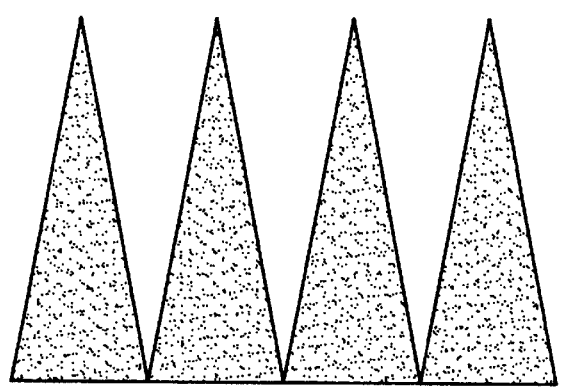
FIG. 8 illustrates an alternative image pattern for use with a preferred embodiment of the present invention.

Indeed, the wedge-shaped mark is not the only mark which is sensitive to variations in the partial coherence factor. Referring to FIGS. 8–10, illustrated therein are representations of other marks which may be utilized with the present invention, including, for example, half-wedge marks or triangles (FIG. 8—similar to those seen in the above-referenced '656 patent), fluted wedges (FIG. 9) or star-shaped shaped marks (FIG. 10). Although the wedge-shaped marks 24 are preferred at the present time by the inventors, the marks in FIGS. 8–10, or any other mark which exhibits high sensitivity to variations in sigma may be utilized with the present invention. A common feature of such marks is that an angle is formed at a location in the mark which falls within the above-discussed preferred range for the angles 25 and α seen in FIG. 4.

In operation, a substrate 26 such as a semiconductor wafer is positioned in the exposure field of a projection exposure system having a known or specified partial coherence value at a location in the exposure field. For purposes of the discussion which follows, the substrate discussed will be a wafer for use in semiconductor fabrication. However, the use of the wafer is merely for purposes of discussion. As discussed above, the present invention is not limited to use with semiconductor wafers, but may be utilized in any exposure process.

In the illustrated embodiment, a plurality of the wedge-shaped marks 24 are projected at various locations in the exposure field in order to expose the photoresist layer formed on a wafer. Those skilled in the art will appreciate that in an ideal situation, the optical system will have no aberrations, the measurement tool will be capable of perfect measurements, and the image plane, focal plane and exposure field will all be perfectly flat and in known locations. In this ideal situation, the exposure of the images in the exposure field will simply involve positioning the wafer having the photoresist layer in the focal plane, exposing the photosensitive layer with the mask having the wedge marks 24 formed thereon, and then utilizing the LSA system to measure and output the lengths of the measured images. Of course, the skilled artisan is well aware that there is no such thing as the perfect exposure environment.

In reality, the focal plane of the exposure apparatus is shifted from the ideal position due to aberrations in the optical system and other factors. Further, the wafer and photoresist or photosensitive layer is not flat in actual process situations, but includes undulations and differences in thickness depending on the process employed in the fabrication of the layer. In addition, the wafer chuck may not be perfectly flat, but can also include non-uniform surface conditions. As a result, upon observation the imaged marks will include non-uniform characteristics across the exposure field. The measurement tool utilized by the inventor measured each of the marks, and by concentrating on the largest measurements of the marks (i.e. the marks having the best focused images) the inventors were able to determine the sigma values for the system under consideration. One feature of the LSA system is that it is used to initialize a system by printing a number of marks (e.g. a series of four or five wedge-shaped marks) at a predetermined Z-axis setting, then steps a small amount (e.g. 0.1 to 0.3 $\mu$m) and prints another set of identical marks at a slightly different Z-axis setting. By performing this process repeatedly across the wafer, the LSA system is used to determine the Z-axis setting which affords the best focus (i.e. the largest imaging of the wedge marks 24) in the given lithography system.

The inventors obtained data indicative of the relationship between the measured mark lengths, the numerical aperture of the projection lens and the partial coherence value at the best focus position (i.e. where the marks 24 appeared the largest). This data was then stored and the process was repeated with different sizes of marks, different numerical apertures (both $NA_{ill}$ and $NA_{pl}$) and thus different partial coherence values. By repeating this process a number of times for different partial coherence values, a reference information database was developed of the relationship between the length of the projected images, the NA of the projection lens system and the partial coherence factor or sigma ($\sigma$) values. This reference data was then used to compare with measurement data from other exposure systems having unknown across field sigma characteristics to analyze the sigma variations in such systems.

In confirming the viability of their invention for lithography equipment, the inventors developed computer simulations as well as conducted actual experiments on photolithograpy equipment. Data indicative of the relationship between measured mark size, numerical aperture of the projection lens, and partial coherence factor resulting from the computer simulations can be seen in graphical form in FIG. 5. As seen therein, the simulation resulted in a series of curves (solid lines) for different constant $NA_{pl}$ values (0.50, 0.55 and 0.63) in a projection exposure system. In this graph, the length of the measured marks (e.g. the wedge-shaped marks 24) are plotted along the Y axis while the partial coherence factor is plotted along the X axis. The simulated data indicated to the inventors that it was possible to provide a correspondence between the length of a projected image and the partial coherence value at the location where the image is measured. The dashed lines in the chart of FIG. 5 correspond to the constant values of the numerical aperture of the illumination system. The linearity of these lines indicated to the inventors that by changing the $Na_{pl}$ for constant values of $NA_{ill}$, it would be possible to provide a linear shift in the image size.

When the experimental results on an actual projection exposure system were completed, the results verified to the inventors that the variations in image size of the wedge-shaped marks 24 directly corresponded to variations in the partial coherence values across the exposure field. The experimental data is illustrated in graphical form in FIG. 6. In this figure, the solid lines represent data curves corresponding to sigma changes at constant values of the numerical aperture of the projection lens system while the dashed lines represent sigma changes at constant values of the numerical aperture of the illumination system. As seen therein, the experimental results closely match the simulation seen in FIG. 5.

Specifically, as expected, the largest image lengths were observed with the highest $NA_{pl}$ values (0.63). As the $NA_{pl}$ was adjusted downward from 0.63 to 0.55 and finally to 0.50, the maximum observed mark length dropped from approximately 10.6 $\mu$m to 9.9 $\mu$m. In addition, the experimental results showed that by adjusting the numerical aperture of the illuminator, $NA_{ill}$, it was possible to produce a linear shift in the image size. So, for example, with the $NA_{pl}$ set at 0.50, by shifting the $NA_{ill}$ from 0.34 to 0.15, it was possible to change the image size from ~8.75 $\mu$m to ~9.90 $\mu$m. This corresponded to a change in sigma from ~0.68 to ~0.3. Thus, by adjusting the sigma value for the system, the inventors were able to produce a significant change in the image size. By determining the relationship between the projected image length, NA and sigma values as seen in FIG. 6, this reference data can then be used to determine unknown partial coherence factor or sigma values at any location in an exposure field.

Figure 6:
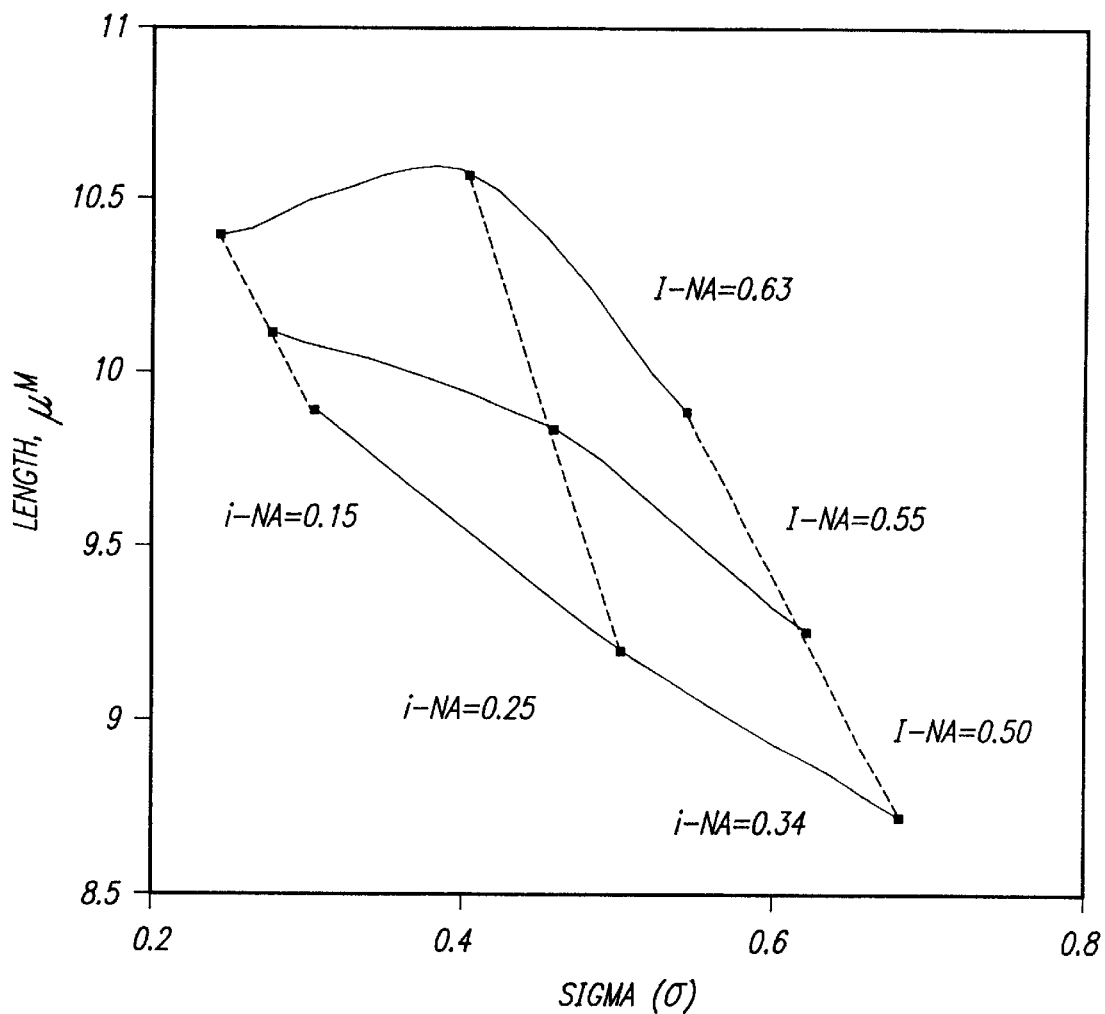
FIG. 6 shows in graphical form a plurality of numerical aperture curves derived from experimental data in which the ordinate or Y-axis represents the measured length of the wedge-shaped mark and the abscissa or X-axis represents the partial coherence factor, or sigma ($\sigma$).

For example, the wedge-shaped marks 24 which were utilized to produce the reference data resulting in the graph seen in FIG. 6 were used by the inventors to analyze the across field sigma variation in an i-line projection exposure system with unknown across field sigma values. Specifically, the mask containing the wedge-shaped marks 24 which were used to obtain the reference seen in FIG. 6 was used to produce a projected image in a photoresist layer in the projection exposure system having the unknown sigma ($\sigma$) values. Of course, the same magnification or reduction ratio which was used in the system having the known sigma value to obtain the reference data was also used in the projection of the wedge marks in the system having the unspecified or unknown sigma value. The projected images of the wedge-shaped marks 24 were then measured. In obtaining these measurements, as mentioned above, the inventors utilized the LSA system in the projection exposure system which was being analyzed. The measurements may be performed, however, using any desired measurement technique or tool, including the above-described LSA measurement technique, a scanning electron microscope, a CCD camera, etc.

Since the numerical aperture (NA) of the projection lens in the system under analysis by the inventors was a known quantity, once the length of the projected images was determined, the previously determined reference data indicative of the relationship between the length of the projected image, the numerical aperture of the projection lens and the sigma values was used by the inventors as a look-up table to determine the sigma values corresponding to each measurement of the projected image in the system under analysis. Specifically, using the X–Y graph seen in FIG. 6, with the length of the measured image, the inventors chose the solid line curve representing the numerical aperture of the projection system to determine the sigma ($\sigma$) value at the location of the measured image. As those skilled in the art readily appreciate, since the curves seen in FIG. 6 represent a number of data points, it is a relatively simple matter to automate this look-up function by storing the reference data in memory as discussed in more detail below.

Figure 7:
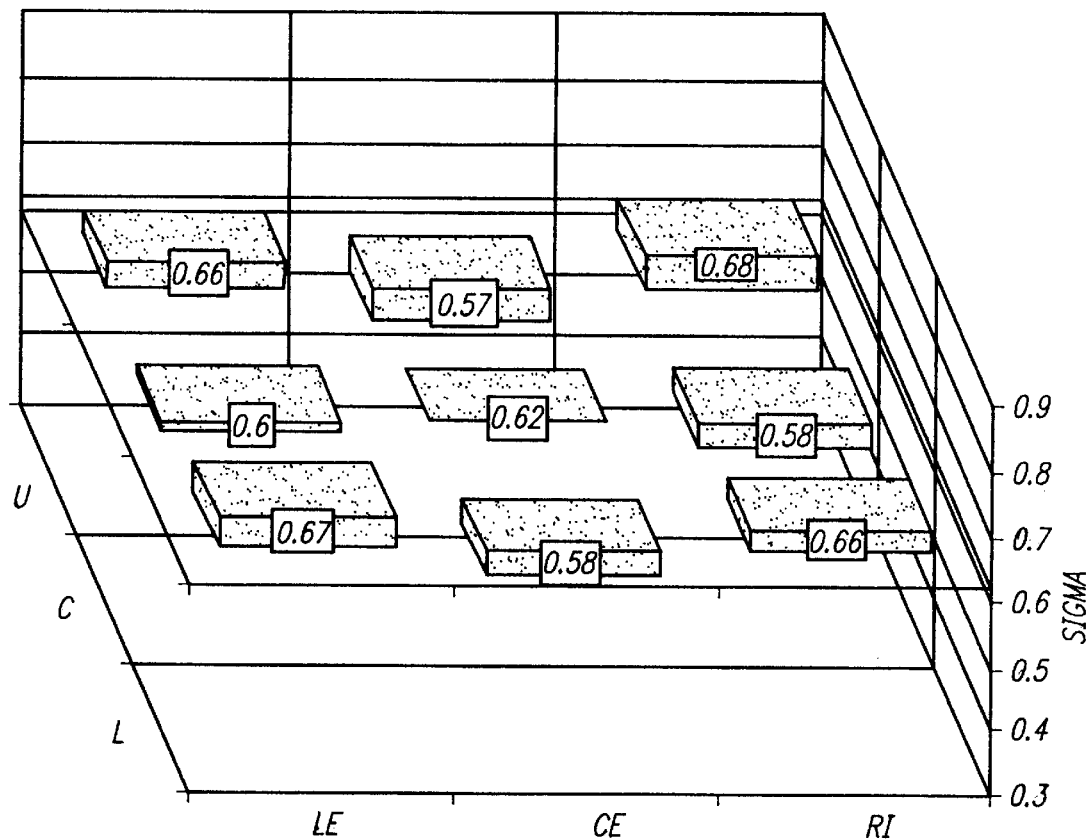
FIG. 7 shows in three-dimensional graphical form the variations of the partial coherence factor across the exposure field in an actual semiconductor fabrication device determined in accordance with the present invention.

The results of the inventors' experimental measurements can be seen in the three-dimensional graph of FIG. 7. The three-dimensional plot seen in FIG. 7 utilizes standard semiconductor industry references for the locations on the wafer which was used to obtain the measurement data. Specifically, the letters U, C, L, LE, CE and RI refer to the quadrants on the surface of the semiconductor wafer. Each wafer is divided into nine quadrants, with the U, C and L representing Upper, Center and Lower, while LE, CE and RI represent Left, Center and Right, respectively.

As seen in FIG. 7, the measurements were taken on an i-line lithography device with an NA of the illuminator of 0.34, an NA of the projection lens of 0.55 and a "nominal" sigma of 0.62. The term nominal is used because this sigma value is from the formula $NA_{ill}/NA_{pl}$. Once the focus position of the lithography system was optimized, the test system did indeed exhibit a sigma of 0.62 at the center location C–CE. However, when the inventors performed measurements in each of the remaining eight quadrants to determine the respective effective sigma values, the results showed sigma variations across the exposure field from 0.57 to 0.68.

As mentioned above, the data indicative of the correspondence between the measured image sizes, the numerical aperture and sigma values, may be stored in the memory 40 and utilized as a look-up table. Indeed, the LSA system will automatically store the measured lengths in memory 40 in normal operation. By utilizing the measured image size and the numerical aperture of the lithography system under consideration as address components, the sigma value for the measurement under consideration can be automatically provided by memory 40 in response to the address provided. Of course, those skilled in the art will readily appreciate that memory 40 may be any suitable memory device, include a ROM, RAM, EPROM, hard disk, floppy disk, magnetic tape, CD-ROM or any other type of machine-readable media. In this fashion, the across field sigma variations for the system being analyzed can be determined quickly, reliably and with great accuracy.

Figure 5:
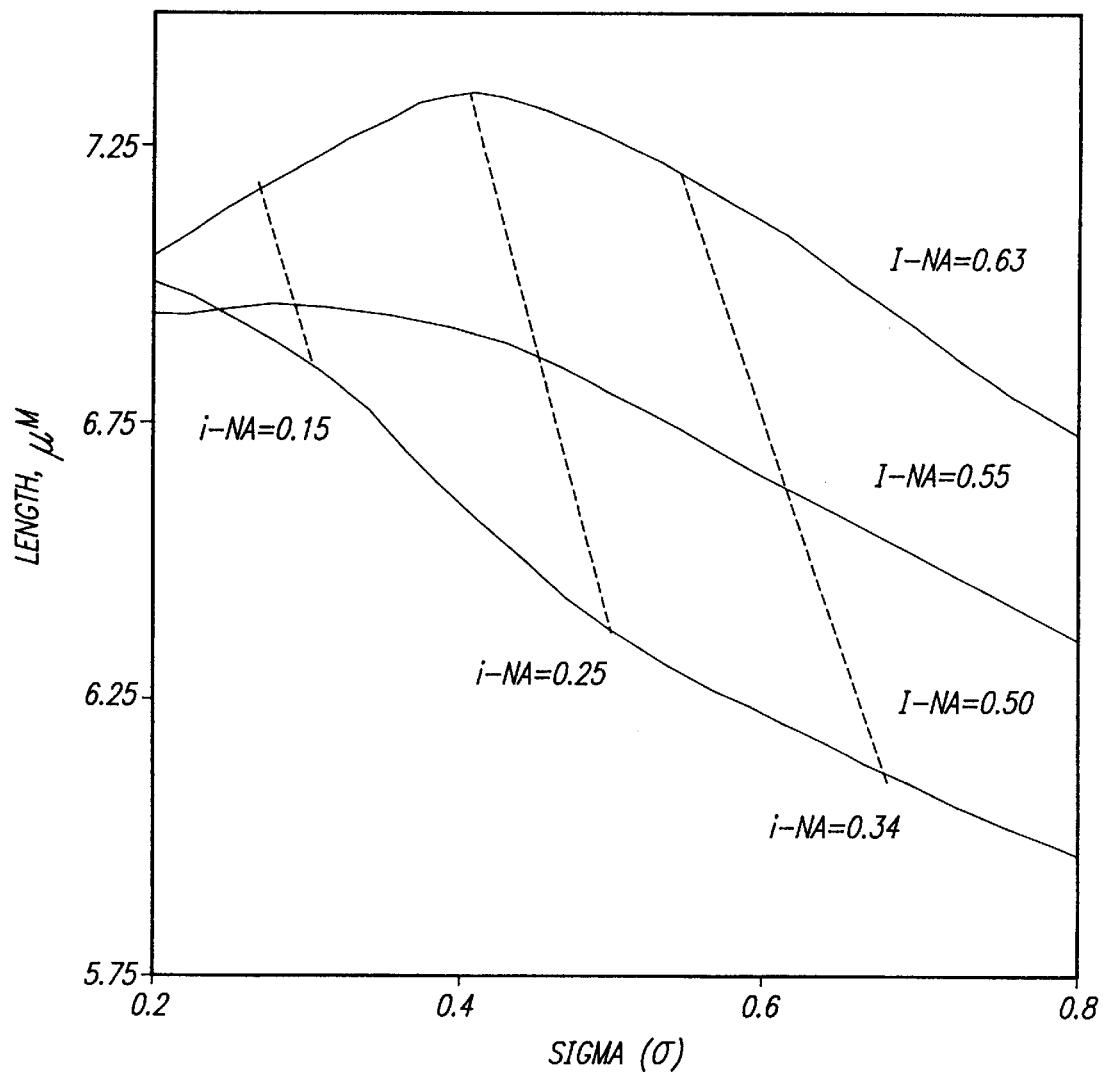
FIG. 5 shows in graphical form a plurality of computer simulated numerical aperture curves in which the ordinate or Y-axis represents the measured length of the wedge-shaped mark and the abscissa or X-axis represents the partial coherence factor, or sigma ($\sigma$).

Alternatively, the signal processor 38 may calculate the sigma values based on the measurement of the image and the corresponding NA for the system under consideration in a similar manner to that which was performed to obtain the simulated results seen in FIG. 5. However, given the complexity of the equations involved in sigma calculations, using the hardware and software currently available this method will be slow and will only result in an approximation (i.e. calculated) of the actual sigma value. However, as signal processor speed advances, the speed of these calculations will increase, thus making this a viable alternative to the look-up technique described above.

Thus, for an image having a known size which is projected in virtually any location in the exposure field, the inventors are able to determine the precise value of the effective partial coherence factor in the specified (i.e. measured) image location. Further, across field variations in the partial coherence factor can be determined so that the overall system sigma value can be adjusted to minimize discrepancies in the partial coherence factor across the exposure field. Alternatively, adjustments to, for example, the lens system, the illumination system, the fly's eyes lens, the shutter and other portions of the system may be made depending on the type of lithography system and the process used therein, to correct for sigma variations across the exposure field. In some instances, it may be necessary to make corrections to the optical system (either the illumination or projection optics) in order to optimize the partial coherence factor across the exposure field.

Accordingly, with the present invention it is now possible to easily and accurately determine the variations in the partial coherence factor across the image field in projection exposure systems (i.e., the effective partial coherence factors). In addition to evaluating the ability of the present invention to determine effective sigma values, the inventors conducted experiments to determine the effect on the present invention caused by aberrations in the lithographic systems being studied. After considering the effects of astigmatism, field curvature, coma, distortion and spherical aberration, each of these aberrations was found to have a small, or negligible, impact on the accuracy of the measurements with the present invention. In addition, the technique of the present invention can also be applied to measure other performance characteristics such as aberrations in lithography systems. Such aberrations include spherical aberrations, coma, astigmatism, and chromatic aberrations as well as the impact of vibration on the lithographic system.

Accordingly, as those skilled in the art will readily appreciate, it is now possible to quickly and easily determine the effective partial coherence factor across the field in a projection exposure system, and then to optimize the partial coherence factor based upon the known variations in the sigma values across the exposure field.

The present invention allows for rapid and reproducible measurements of the variation in the partial coherence factor across the image plane or exposure field and is not sensitive to parameters which are uncontrollable such as optical aberrations, defocus, exposure energy or photoresist properties or process conditions. Accordingly, the system of the present invention is economical, reliable and accurate, thus enabling users of projection exposure systems to minimize across chip linewidth variations due to deviations in the partial coherence factor across the image field.

While the present invention has been described in terms of the above-discussed preferred embodiments, those skilled in the art will readily appreciate that the present invention is not limited to the above-described preferred embodiment. Numerous modifications, additions and substitutions can be made to the above-described preferred embodiments without departing from the spirit and scope of the present invention.

For example, the system of the present invention is in no way limited to projection exposure systems which utilize the so-called i-line or KrF illumination sources. The present invention is suitable for use in any lithographic system which utilizes a source of radiation to project an image. The wavelength of the source of illumination is not a feature of the instant invention nor is the instant invention limited to use with particular radiation sources or wavelengths of light.

In addition, the present invention is not limited to the types of lithographic systems illustrated. For example, while FIGS. 1 and 2 show a vertical exposure system, the present invention is suitable for use in horizontal exposure systems. Further, the present invention is in no way limited to use with lithographic systems which produce semiconductor wafers, but is suitable for use in other projection exposure systems.

As those skilled in the art will readily appreciate, numerous other modifications, additions and substitutions to the presently disclosed invention are possible without departing from the spirit and scope thereof. The instant inventors intend that all such modifications, substitutions and additions fall within the scope of the present invention which is best defined by the claims which appear below.

What is claimed is:

1. An apparatus for determining a partial coherence factor in a lithography system which includes a source of radiation and a projection system, the apparatus comprising:

a mask having an image formed thereon;

a substrate onto which the image on said mask is projected by radiation projected through said projection system;

a measuring device, said measuring device measuring a size of said projected image and producing a signal indicative thereof; and a processor responsive to said signal from said measuring device for determining said partial coherence factor based on said measured image size.

2. An apparatus according to claim 1, wherein said processor includes a memory for storing data indicative of relationships between projected image size and partial coherence factor values, said processor comparing said signal indicative of said projected image size with said data stored in said memory.

3. An apparatus according to claim 1, wherein said measuring device comprises a laser step alignment system.

4. An apparatus according to claim 3, wherein said laser step alignment system includes a laser source for producing a laser beam, said laser step alignment system scanning said projected image with said laser beam, thereby causing light from said laser beam to be at least one of diffracted and scattered from said projected image.

5. An apparatus according to claim 4, wherein said laser step alignment system includes a detector for detecting said at least one of diffracted and scattered light, said detector producing a signal indicative of a size of said projected image in response to said detection of said at least one of diffracted and scattered light.

6. An apparatus according to claim 1, wherein said image formed on said mask includes at least one wedge-shaped mark.

7. An apparatus according to claim 6, wherein said image formed on said mask includes a plurality of wedge-shaped marks.

8. An apparatus according to claim 1, wherein said image formed on said mask includes at least one triangle shaped mark.

9. An apparatus according to claim 8, wherein said image formed on said mask includes a plurality of triangle shaped marks.

10. An apparatus according to claim 1, wherein said image formed on said mask includes at least one fluted wedge mark.

11. An apparatus according to claim 1, wherein said image formed on said mask includes at least one star-shaped mark.

12. An apparatus according to claim 2, wherein said memory comprises a machine readable media, said machine readable media storing data indicative of a plurality of relationships between image size, numerical aperture and partial coherence factor values.

13. An apparatus according to claim 6, wherein said at least one wedge-shaped mark includes a point at one end of said wedge-shaped mark, said point defining an angle $\alpha$, where $\alpha$ is an angle approximately in a range $10° \geq \alpha \geq 4°$.

14. An apparatus for determining sigma values in an exposure field of a lithography system which includes a source of illumination, a projection optical system, a mask stage, and a substrate stage, the apparatus comprising:

a mask having a predetermined image formed thereon and disposed on said mask stage;

a substrate having a photosensitive layer formed thereon and disposed on said substrate stage such that illumination from said source of illumination causes said predetermined image on said mask to be projected onto said photosensitive layer through said projection optical system;

a measuring tool for measuring a size of said image projected on said photosensitive layer and producing a signal indicative thereof;

a memory for storing data indicative of relationships between projected image size and sigma values; and a signal processor responsive to said signal from said measuring tool for accessing said memory in accordance with said signal to obtain a corresponding sigma value based on said measured image size.

15. An apparatus according to claim 14, wherein said image formed on said mask includes at least one wedge-shaped mark.

16. An apparatus according to claim 15, wherein said image formed on said mask includes a plurality of wedge-shaped marks.

17. An apparatus according to claim 14, wherein said image formed on said mask includes at least one triangle shaped mark.

18. An apparatus according to claim 17, wherein said image formed on said mask includes a plurality of triangle shaped marks.

19. An apparatus according to claim 14, wherein said image formed on said mask includes at least one fluted wedge mark.

20. An apparatus according to claim 14, wherein said image formed on said mask includes at least one star-shaped mark.

21. An apparatus according to claim 14, wherein said measurement tool comprises a laser step alignment system.

22. An apparatus according to claim 21, wherein said laser step alignment system includes a laser source for producing a laser beam, said substrate stage moves said substrate such that said laser beam scans said projected image, thereby causing light from said laser beam to be at least one of diffracted and scattered from said projected image.

23. An apparatus according to claim 22, wherein said laser step alignment system includes a detector for detecting said at least one of diffracted and scattered light, said detector producing a signal indicative of a size of said projected image in response to said detection of said at least one of diffracted and scattered light.

24. An apparatus according to claim 14, wherein said signal processor compares said measured image size with said data stored in said memory to determine a sigma value corresponding to said signal.

25. An apparatus according to claim 24, wherein said memory comprises a machine readable media, said machine readable media storing data indicative of a plurality of relationships between image size, numerical aperture and sigma values.

26. An apparatus according to claim 14, wherein said predetermined image is projected onto said photosensitive layer at a plurality of measurement locations.

27. An apparatus according to claim 26, wherein said measuring tool measures said projected image size at said plurality of locations and produces a plurality of measurement signals indicative of said measured images, said signal processor receiving each of said plurality of measurement signals and accessing said memory in accordance with each received measurement signal to obtain a corresponding sigma value for each of said plurality of measurement signals.

28. A method for determining a partial coherence factor in a projection exposure system, said method comprising the steps of:
   a. illuminating an image in a first projection exposure system having a known partial coherence factor to produce a first projected image;
   b. measuring said first projected image to obtain data indicative of a relationship between a size of the first projected image and the known partial coherence factor;
   c. illuminating said image in a second projection exposure system having an unknown partial coherence factor to produce a second projected image;
   d. measuring said second projected image; and
   e. determining said unknown partial coherence factor based upon said measurement of said second projected image and said obtained data.

29. The method according to claim 28, wherein said projected image comprises a wedge mark including at least one tapered end point.

30. The method according to claim 29, wherein said projected image comprises a plurality of wedge marks.

31. The method according to claim 30, wherein said projected image comprises a plurality of includes at least one triangle shaped mark.

32. The method according to claim 28, wherein said projected image comprises a plurality of triangle shaped marks.

33. The method according to claim 28, wherein said projected image comprises at least one fluted wedge mark.

34. The method according to claim 28, wherein said projected image comprises at least one star-shaped mark.

35. The method according to claim 28, wherein said obtained data indicative of a relationship between a size of the first projected image and the known partial coherence factor is stored in a machine readable media.

36. The method according to claim 35, wherein said determining step includes the step of comparing said measurement of said second projected image with said data stored in said machine readable media.

37. A method for determining a predetermined performance characteristic in an exposure field of a projection exposure system including an illumination source, projection optics and a substrate stage, said method comprising the steps of:
   a. illuminating an image formed on a mask with illumination from said illumination source, said illuminated image being projected by said projection optics onto a substrate disposed on said substrate stage in the exposure field of said projection exposure system;
   b. measuring a size of said image projected onto said wafer;
   c. comparing said measurement of said projected image with data indicative of previously determined relationships between projected image size and said predetermined performance characteristic; and
   d. determining said predetermined performance characteristic based upon said comparison.

38. A method according to claim 37, wherein said mask has a plurality of images formed thereon, said illuminating step including the step of illuminating said plurality of images to produce a plurality of projected images at a plurality of locations on said substrate.

39. A method according to claim 38, wherein said measuring step includes the step of measuring said plurality of projected images at said plurality of locations on said substrate, each measurement of said plurality of images being compared with said data indicative of previously determined relationships between projected image size and said predetermined performance characteristic to determine a value for said predetermined performance characteristic at each location of said plurality of images.

40. A method according to claim 39, wherein said plurality of projected images include a plurality of wedge-shaped marks.

41. A method according to claim 39, wherein said plurality of projected images include at least one triangle shaped mark.

42. A method according to claim 39, wherein said plurality of projected images include at least one fluted wedge mark.

43. A method according to claim 39, wherein said plurality of projected images include at least one star-shaped mark.

44. A method according to claim 37, wherein said step of measuring includes a step of performing said measurement with a laser step alignment system.

45. A method according to claim 38, wherein said data indicative of previously determined relationships between projected image size and values for said predetermined performance characteristic is stored in machine readable media.

46. A method according to claim 45, wherein said laser step alignment system produces measurement data indicative of said size of said projected image, said comparing step including the step of comparing said measurement data with said data stored in said machine readable media.

47. A method according to claim 37, wherein said predetermined performance characteristic comprises a partial coherence factor.

48. A method for determining a partial coherence factor in a lithography system which includes a source of radiation, a projection system, a mask and a substrate, the method comprising:
   projecting an image formed on said mask onto said substrate using radiation projected through said projection system;
   measuring a size of said projected image and producing a signal indicative thereof; and
   determining said partial coherence factor based on said measured image size.

49. The method according to claim 48, wherein said determining step further includes the step of comparing said measured image size with data stored in a machine readable media indicative of relationships between projected image size and partial coherence factor values to determine said partial coherence factor.

50. The method according to claim 48, wherein said measuring step includes measuring said projected image with a laser step alignment system.

51. The method according to claim 48, wherein the step of projecting an image includes projecting an image of at least one wedge-shaped mark.

52. The method according to claim 51, wherein the step of projecting an image includes the step of projecting an image of a plurality of wedge-shaped marks.

53. The method according to claim 48, wherein the step of projecting an image includes the step of projecting an image of at least one triangle shaped mark.

54. The method according to claim 53, wherein the step of projecting an image includes the step of projecting an image of a plurality of triangle shaped marks.

* * * * *